(12) United States Patent
Yokota

(10) Patent No.: US 6,423,945 B1
(45) Date of Patent: Jul. 23, 2002

(54) DEVICE FOR HEATING PRINTED-CIRCUIT BOARD

(75) Inventor: Yatsuharu Yokota, Tokyo (JP)

(73) Assignee: Eighttech Tectron Co., Ltd., Tokyo (JP)

( * ) Notice: Subject to any disclaimer, the term of this patent is extended or adjusted under 35 U.S.C. 154(b) by 0 days.

(21) Appl. No.: 09/701,428

(22) PCT Filed: Apr. 3, 2000

(86) PCT No.: PCT/JP00/02152

§ 371 (c)(1),
(2), (4) Date: Nov. 29, 2000

(87) PCT Pub. No.: WO00/60913

PCT Pub. Date: Oct. 12, 2000

(30) Foreign Application Priority Data

Apr. 6, 1999 (JP) .......................................... 11-098932
May 14, 1999 (JP) .......................................... 11-134906
Mar. 17, 2000 (JP) ........................................ 2000-077202

(51) Int. Cl.[7] ................................................ F27B 9/32
(52) U.S. Cl. ..................... 219/388; 219/405; 432/247
(58) Field of Search ................................ 219/388, 400, 219/405, 395, 399, 701; 228/42, 46, 37, 8; 134/2; 432/247

(56) References Cited

U.S. PATENT DOCUMENTS 4,687,895 A * 8/1987 Chitre et al. ................ 219/701
5,364,007 A * 11/1994 Jacobs et al. ................. 228/42
5,409,543 A * 4/1995 Panitz et al. .................. 134/2
5,433,368 A * 7/1995 Spigarelli ..................... 228/8
5,685,475 A * 11/1997 Jairazbhoy et al. ........... 228/37

FOREIGN PATENT DOCUMENTS

| JP | 5-190917 | 7/1993 |
| JP | 6-168899 | 6/1994 |
| JP | 7-212026 | 8/1995 |
| JP | 7-334164 | 12/1995 |

* cited by examiner

Primary Examiner—Joseph Pelham
Assistant Examiner—Quang Van
(74) Attorney, Agent, or Firm—Armstrong, Westerman & Hattori, LLP

(57) ABSTRACT

An apparatus for heating a printed circuit board includes a conveyor (2) to transport a printed circuit board (1), and a heating chamber (3) through which the printed circuit board on the conveyor passes. The surrounding wall (9) of the heating chamber has vacuum layers (12) (13) for heat insulation, and a reinforcing rib (19) is fastened to the surrounding wall. A member for preventing collapse of the surrounding wall is inserted and secured in the vacuum layer in the surrounding wall. The member includes a stainless steel channel member (17) and a heat insulating plate (18) with a rectangular cross section. White cotton used as a member (20) for intercepting radiant heat is installed within the vacuum layer in the surrounding wall, and a radiant heat reflective layer (22) of aluminum foil, etc. is installed on the surface of the surrounding wall facing the heating chamber.

10 Claims, 10 Drawing Sheets

DEVICE FOR HEATING PRINTED-CIRCUIT BOARD

TECHNICAL FIELD

This invention relates to an apparatus for heating printed circuit boards which is comprised of a conveyor to transport printed circuit boards, and a heating chamber through which the printed circuit boards on the conveyor pass.

BACKGROUND ART

In this type of apparatus, there is for example a reflow soldering apparatus. In this reflow soldering apparatus, printed circuit boards mounted with electronic components are heated in a heating chamber filled for example with an inert gas, while being transported by a conveyor, and the solder paste melts and the electronic components are soldered. In the apparatus of the conventional art, heat insulating material such as glass wool is installed on the surrounding wall of the heating chamber for a high temperature in the heating chamber, and the heat is kept within the heating chamber by means of this type of heat insulating material.

In this type of apparatus, however, the heating chamber is required to achieve high temperatures with a heater, so that along with consuming as little electrical power of the heater as possible and having energy-saving features, a design with low running costs is needed.

However, since the apparatus of the conventional art uses a heat insulating material such as glass wool for heat insulation in the heating chamber, there is a limit to the degree of obtainable heat insulation. When the glass wool is made thicker to improve the heat insulation, the dimensions around the heating chamber become larger, leading to the problem of an apparatus of increased size and weight. Therefore, using the apparatus of the conventional art requires increasing the amount of electrical power to the heater in order to compensate for lowering of heating chamber temperatures, the electrical power consumption of the heater increases, and along with the problem of poor energy-saving, also brings about the problem of high running costs due to the high electrical fees.

This type of apparatus also needs a design of course capable of insulating the heating chamber, yet producing as little industrial waste as possible when disposal of the apparatus is required, in view of the need for protecting the environment and reducing the amount of rubbish.

The apparatus of the conventional art uses a heat insulating material such as glass wool and this type of heat insulating material is normally used in a thickness of 3 to 4 centimeters on the surrounding wall of the heating chamber. Accordingly, large quantities of heat insulating material are used in the apparatus of the conventional art, causing the unavoidable problem that large quantities of industrial waste are generated by this heat insulating material becoming trash when disposal of the apparatus is required.

This invention therefore has the object of providing an apparatus for heating a printed circuit board which is capable of reducing electrical power consumption of the heater due to good heat insulation, and also reducing amount of industrial waste.

DISCLOSURE OF INVENTION

An apparatus for heating a printed circuit board of this invention comprises a conveyor to transport a printed circuit board, and a heating chamber through which the printed circuit board on the conveyor passes, wherein a vacuum layer for heat insulation is formed in a surrounding wall of the heating chamber.

The printed circuit board includes not only a board in which a conductor is fixed to the board, but also a board in which electronic components are mounted on the board having a conductor fixed. A drying device and a soldering apparatus are for example present in the apparatus for heating a printed circuit board.

The vacuum layer for heat insulation is preferably formed to cover the entire circumferential area of the heating chamber, however forming the vacuum layer on just the desired sections is permissible.

A rib for reinforcing the surrounding wall is preferably secured to the surrounding wall in order to prevent warping of the surrounding wall. The reinforcing rib preferably has a cross section with a T-shape, an I-shape, a channel shape, an inverted L-shape or a rectangular shape. Manufacture of any of the above type of rib is easy, and increased strength in the surrounding wall can be obtained in the simple structure. The reinforcing rib is provided on at least one of the outer circumferential surface of the surrounding wall and the inner circumferential surface facing the heating chamber. The reinforcing rib is also preferably provided on the periphery of the surrounding wall at a surface perpendicular to the direction of conveyor transport for increased strength.

This invention is further preferably installed with a member in the vacuum layer to prevent collapse of the surrounding wall. The surrounding wall can be hardened even further by insertion of this member. Preferably, at least a portion of this member is formed of heat insulation material to prevent heat conduction. Preferably, as small an area as possible is selected for the area where the member contacts the surrounding wall in order to suppress heat conduction. When the vacuum layer is formed in separate compartments by means of the above member, then each compartment is preferably communicated with each other.

This invention is preferably installed with a member in the vacuum layer to intercept radiant heat. A high heat insulating effect is obtained when such a member is installed because the radiant heat is intercepted. White cotton, glass fibers or gypsum, etc. may be utilized as the material for intercepting the radiant heat. If a radiant heat reflective member such as aluminum foil or silver paper is placed over the radiant heat intercepting member, an ever higher heat insulating effect can be obtained.

A reflective layer for radiant heat is preferably provided on the surface of the surrounding wall facing the heating chamber. Installing this reflective layer further prevents radiant heat from escaping outside the heating chamber.

A vacuum pump is preferably connected to the vacuum layer in the surrounding wall to allow evacuating the vacuum layer. If there is a drop in the vacuum level in the vacuum layer in the surrounding wall, a vacuum pump allows constantly maintaining the vacuum level in the vacuum layer in the surrounding wall at a specified level.

The heating chamber of this invention further preferably comprises a preheating chamber for preheating the printed circuit board, a reflow soldering chamber for melting the solder paste and soldering the electronic components on the printed circuit board, arranged in order, along the direction of transport by the conveyor. In such cases, the heating chamber for the reflow soldering apparatus can be heat insulated by vacuum. When a plurality of heating chambers are used, then a vacuum layer may be formed only for the desired heating chamber.

BEST MODE FOR CARRYING OUT THE INVENTION

One preferred embodiment for this invention is next explained while referring to the accompanying drawings.

Figure 1:
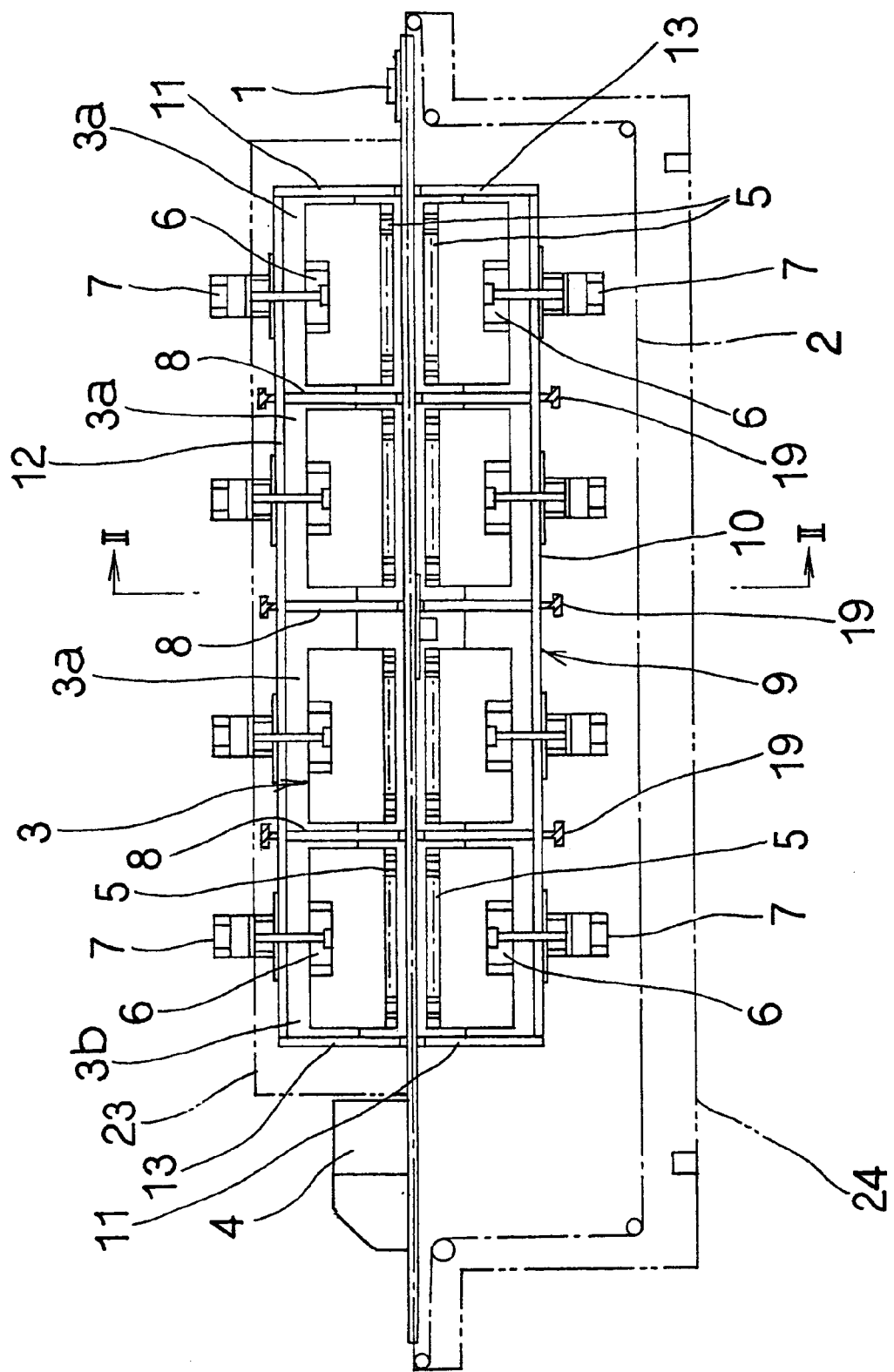
FIG. 1 is a vertical cross-sectional view showing a preferred embodiment of this invention.

In FIG. 1, a reference numeral 1 denotes a printed circuit board and reference numeral 2 denotes a conveyor for transporting the printed circuit board 1.

Reference numeral 3 denotes a heating chamber for heating the printed circuit board 1. The conveyor 2 extends horizontally in the center section in the vertical direction of the heating chamber 3 and in a cooling chamber 4 disposed adjacent to the heating chamber 3, while the return route for the conveyor is under the heating chamber 3. The printed circuit board 1 is placed on the conveyor 2 at the entrance to the heating chamber 3, and after moving inside the heating chamber 3 by means of the conveyor 2, enters the cooling chamber 4 and is later recovered.

A heater 5 as the heat source, and a fan 6 are installed inside the heating chamber 3. The heaters 5 are installed above and below the conveyor 2, and the fans 6 are installed at the top and bottom ends in the heating chamber 3. Fan motors 7 are installed on the upper and lower external surface of the heating chamber 3. A motor shaft extending through a surrounding wall 9 of the heating chamber 3 is connected to the fan 6. In this embodiment, the heated air within the heating chamber 3 is circulated at a speed of approximately 3 meters per second.

The heating chamber 3 is sub-divided into four chambers by partition walls 8. Of these four chambers, three are pre-heating chambers 3a and one is a reflow soldering chamber 3b, arranged sequentially along the transport direction of the conveyor 2. The heater 5 and the fan 6 are installed in the chambers 3a and 3b of the heating chamber 3. The preheating chamber 3a gradually heats the printed circuit board 1. The printed circuit board 1 is heated to a temperature of approximately 150° C. in the preheating chamber 3a. The reflow soldering chamber 3b melts the solder paste and solders the electronic components. The printed circuit board 1 is heated to a temperature of approximately 230° C. in the reflow soldering chamber 3b. The printed circuit board 1 having the high temperatures after soldering is slowly cooled in the cooling chamber 4.

In this embodiment, nitrogen gas is supplied to the chambers 3a, 3b of the heating chamber 3 as the inert gas. Oxidation of the electronic component leads and the solder is prevented by this nitrogen gas.

Figure 2:
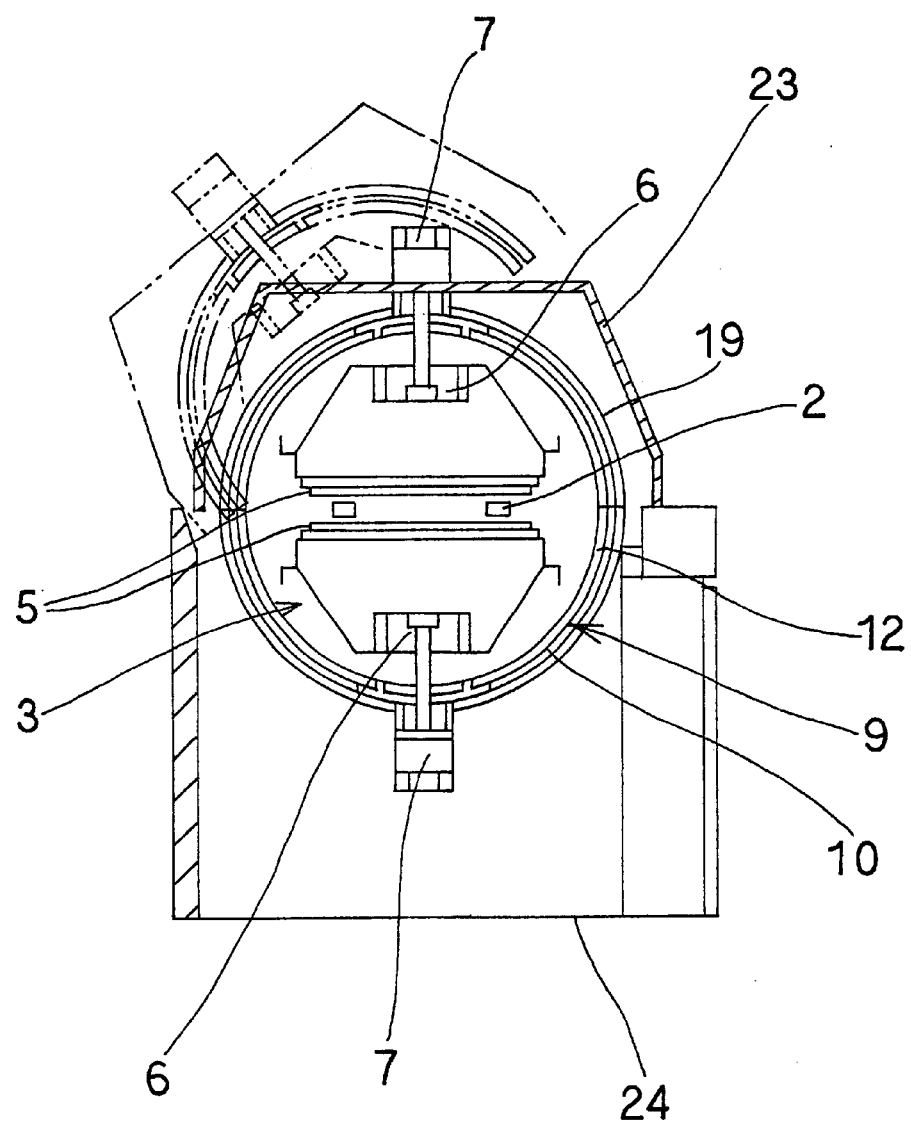
FIG. 2 is a cross-sectional view taken along the line II—II of FIG. 1.

The surrounding wall 9 forming the heating chamber 3, as shown in FIG. 1 and FIG. 2, is comprised of a cylindrical wall 10 covering the periphery of conveyor 2 along the conveyor 2 transport direction, and side walls 11 closing both openings of the cylindrical wall 10. Vacuum layers 12 and 13 for heat insulation are formed in the surrounding wall 9.

Figure 5:
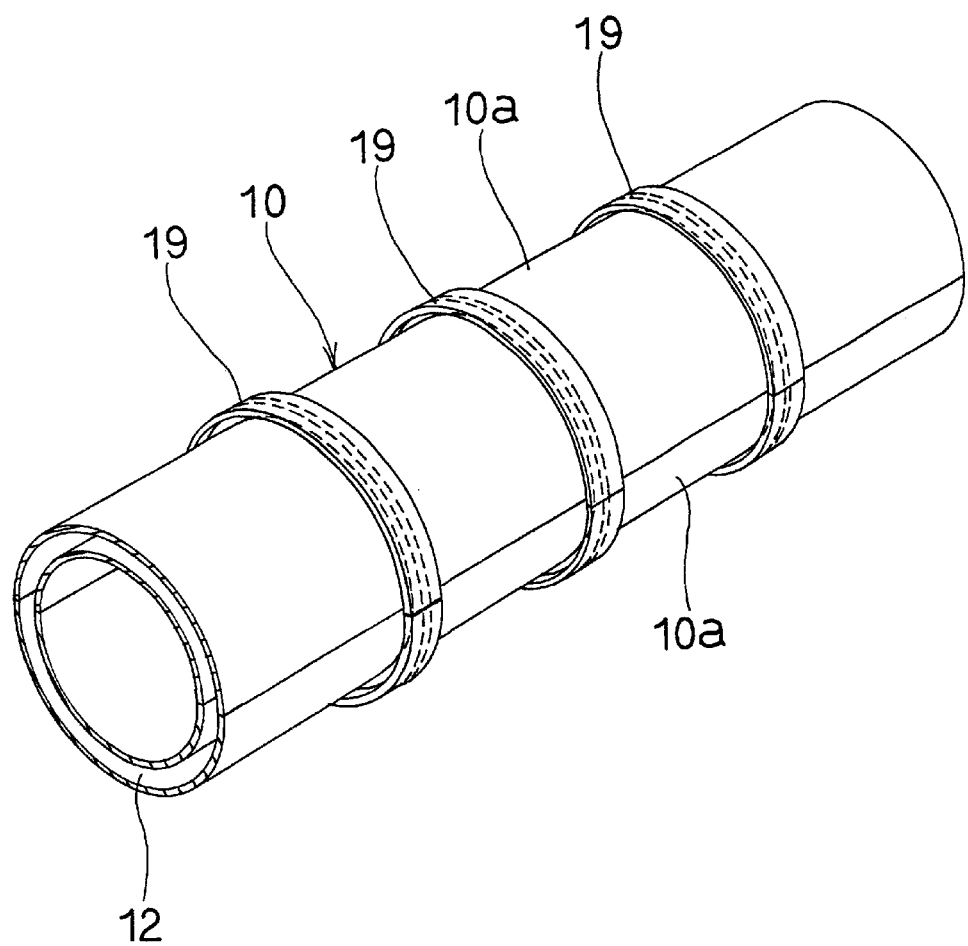
FIG. 5 is a perspective view showing the cylindrical wall cut vertically on one end.

The cylindrical wall 10 of this embodiment is formed of a pair of upper and lower opposite arc-shaped cross-sectional hollow members 10a (See FIG. 5). The hollow member 10a has a pair of long narrow stainless steel plates of approximately one millimeter thickness which are bent in an arc shape and facing each other at fixed intervals. The openings are sealed with stainless steel plates and the interior is evacuated to achieve a vacuum level for heat insulation. The heat insulating vacuum layer 12 is thus formed in the cylindrical wall 10 forming the surrounding wall 9.

Figure 3:
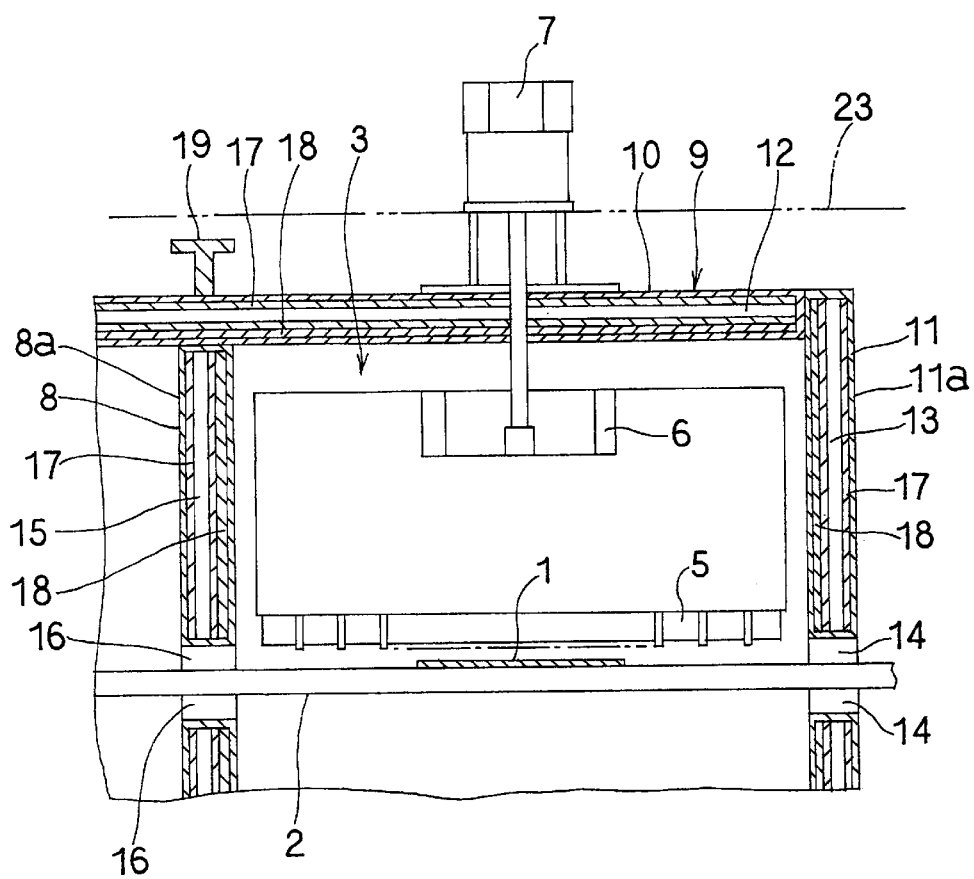
FIG. 3 is an enlarged view showing a portion of FIG. 1.

The side wall 11 is formed of a pair of upper and lower opposite semicircular-shaped hollow members 11a (See FIG. 3). The hollow member 11a has a pair of semicircular stainless steel plates of approximately one millimeter thickness which are facing each other at fixed intervals. The openings are sealed with stainless steel plates and the interior is evacuated to achieve a vacuum level for heat insulation. The heat insulating vacuum layer 13 is thus formed in the side wall 11 forming the surrounding wall 9.

In the side wall 11, the upper and lower hollow members 11a are formed with rectangular concave portions 14 (See FIG. 3) in the opposite positions to form an opening in the center which the conveyor 2 can enter.

Also in this embodiment, the partition wall 8 is formed of a pair of upper and lower opposite semicircular-shaped hollow members 8a (See FIG. 3). The hollow member 8a has a pair of semicircular stainless steel plates of approximately one millimeter thickness which are facing each other at fixed intervals. The openings are sealed with stainless steel plates and the interior is evacuated to achieve a vacuum level for heat insulation. A heat insulating vacuum layer 15 is thus formed in the partition wall 8. In the partition wall 8, the upper and lower hollow members 8a are formed with rectangular concave portions 16 in the opposite positions to form an opening in the center which the conveyor 2 can enter.

Figure 4A:
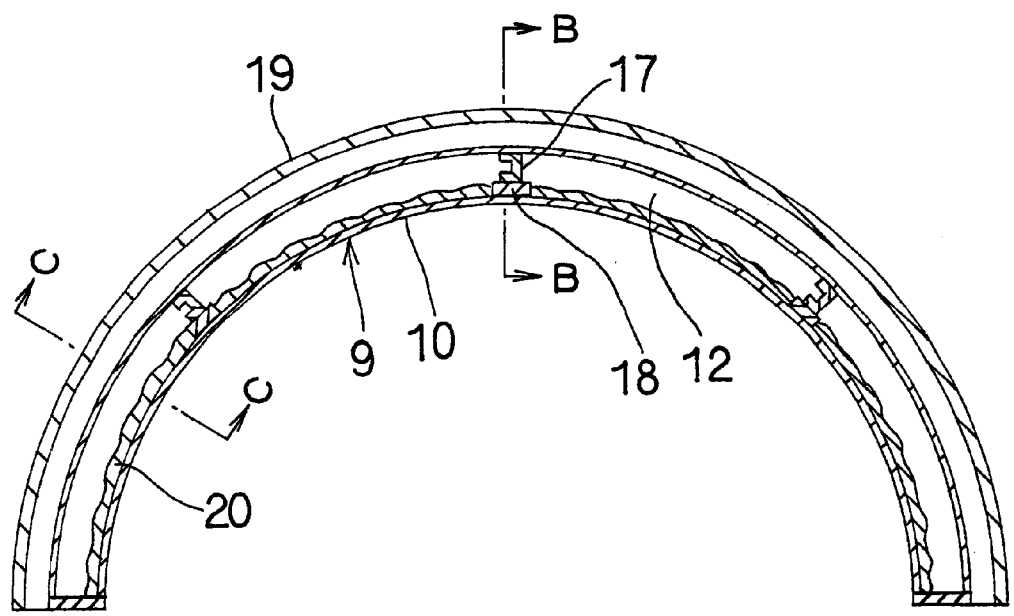
FIG. 4A is a vertical cross-sectional view showing a hollow member forming a cylindrical wall.
Figure 4B:
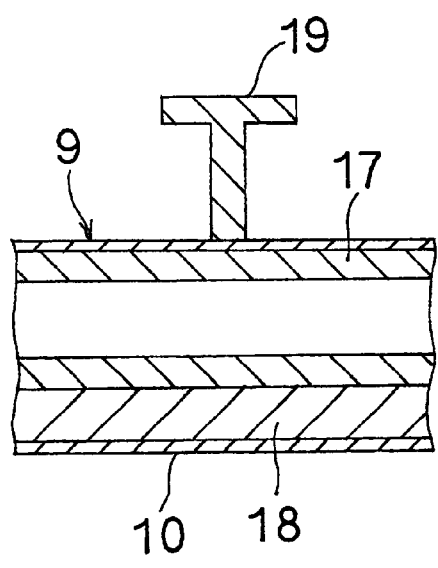
FIG. 4B is a cross-sectional view taken along the line B—B of FIG. 4A.
Figure 4C:
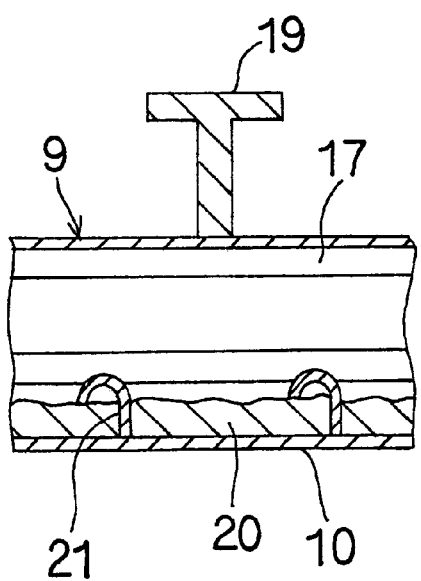
FIG. 4C is a cross-sectional view taken along the line C—C of FIG. 4A.

As shown in FIG. 3 and FIG. 4, a member for preventing the cylindrical wall 10 from collapsing is inserted and fixed in the vacuum layer 12 in the cylindrical wall 10 of the surrounding wall 9. This member is comprised of a stainless steel channel member 17, and a rectangular cross-sectional heat insulating plate 18. The channel member 17 with the opening faced in the circumferential direction is placed on the outer side, and the heat insulating plate 18 is placed on the inner side, extending longitudinally along the entire length of the vacuum layer 12. A plurality of both members 17 and 18 are inserted and secured at fixed intervals along the periphery in the vacuum layer 12. The vacuum layer 12 partitioned by both members 17 and 18 is communicated with each other through the slight gap between these members 17 and 18, and so the entire vacuum layer 12 can be evacuated, however, connecting holes may also be formed as needed in the channel member 17.

The partition wall 8 and the side wall 11 also, as shown in FIG. 3, are provided with a member for preventing collapse which is comprised of the above-mentioned stainless steel channel member 17 and rectangular cross-sectional heat insulating plate 18.

A rib 19 is secured to the surrounding wall 9 to reinforce the surrounding wall 9. As shown in FIG. 1 through FIG. 5, the reinforcing rib 19 is formed from a metallic plate member such as stainless steel with a T-shaped cross section, and is provided along the entire outer circumferential surface of the cylindrical wall 10. A plurality of these reinforcing ribs 19 are provided at appropriate intervals in the longitudinal direction of the cylindrical wall 10.

White cotton is secured as the radiant heat intercepting member 20 on the inner surface along the radial axis within the vacuum layer. 12 in the cylindrical wall 10 of the surrounding wall 9 as shown in FIG. 4. The reference numeral 21 is a hook for fastening the white cotton used as the radiant heat intercepting member 20. A radiant heat reflective member such as silver paper or aluminum foil is preferably laid over the white cotton used as the radiant heat intercepting member 20 to enhance the heat insulating effect.

Figure 6:
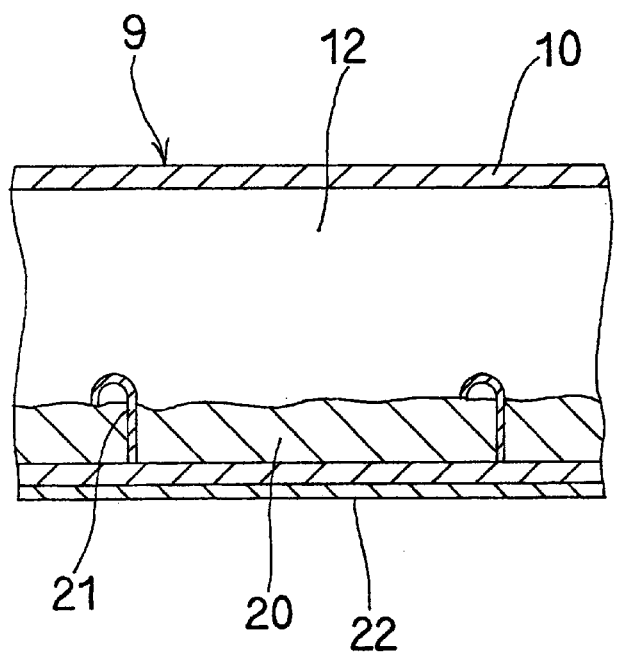
FIG. 6 is an enlarged vertical cross-sectional view showing a portion of the cylindrical wall.

As shown in FIG. 6, a radiant heat reflective layer 22 may also be formed on the surface of the cylindrical wall 10 facing the heating chamber 3. The reflective layer 22 may be formed by plating or by fastening aluminum foil or reflective plate.

In the surrounding wall 9 of this embodiment, the upper and lower hollow members 10a are connected by hinges, and as shown in FIG. 2, are formed to allow the heating chamber 3 to open and close. A cover 23 is fastened to the upper side of the surrounding wall 9 forming the heating chamber 3. The lower side of the surrounding wall 9 is fastened to an apparatus body 24.

The function of this invention is explained next.

The printed circuit board 1 is placed on the conveyor 2 at the entrance to the heating chamber 3, and transported by the conveyor 2 in the heating chamber 3. The printed circuit board 1 is gradually heated in the pre-heating chamber 3a, and the solder paste melts in the reflow soldering chamber 3b and the electronic components are soldered. The printed circuit board 1 next enters the cooling chamber 4 adjacent to the heating chamber 3. The temperature is gradually lowered in the cooling chamber 4 and the printed circuit board 1 is recovered from the conveyor 2.

The heating chamber 3 is heat insulated by the vacuum layers 12 and 13 formed in the surrounding wall 9 to provide heat insulation. The vacuum layer 15 is also formed in the partition wall 8 of the heating chamber 3, so each chamber 3a, 3b of the heating chamber 3 is also heat insulated. Radiant heat can also be intercepted by the white cotton 20 used as the radiant heat intercepting member, so emission of radiant heat to outside can be prevented. Emission of radiant heat to outside can be further prevented by forming the radiant heat reflective layer 22. Transport noises from the conveyor 2 and noise from fan rotation can also be prevented from leaking to the outside since the vacuum layers 12 and 13 also isolate the interior of the heating chamber 3 from outside.

The reinforcing rib 19 can prevent warping of the surrounding wall 9, and the members 17 and 18 for preventing collapse can prevent collapsing of the surrounding wall 9.

In this invention, a vacuum pump may also be connected to the vacuum layers 12 and 13 so that the vacuum level being capable of heat insulating can be maintained when the vacuum level of the vacuum layers 12 and 13 has become low.

Figure 7:
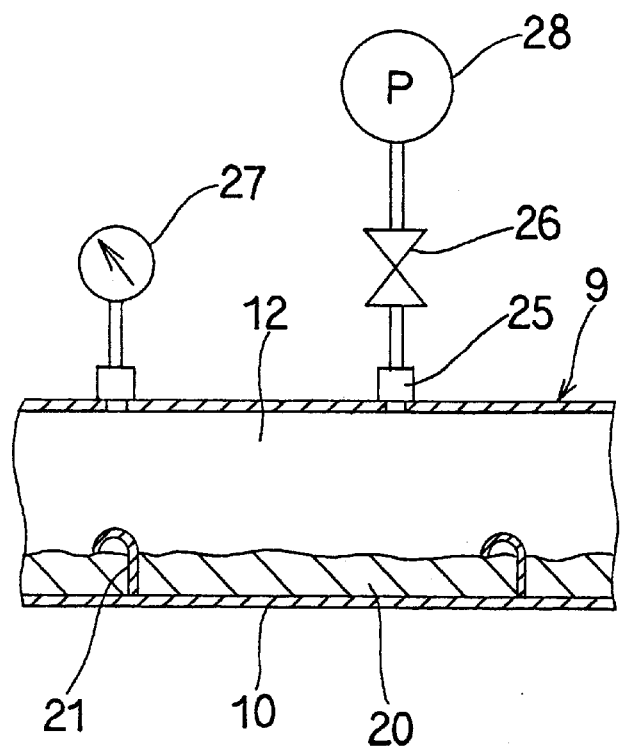
FIG. 7 is a drawing illustrating the connecting structure of the vacuum pump.

In FIG. 7, the reference numeral 25 denotes an exhaust outlet formed in the cylindrical wall 10 of the surrounding wall 9. The reference numeral 26 denotes a valve, reference numeral 27 denotes a pressure gauge installed in the cylindrical wall 10, and the reference numeral 28 denotes a vacuum pump.

When the vacuum level of the vacuum layer 12 has dropped, the vacuum layer 12 is evacuated by the vacuum pump 28, so that a vacuum level necessary for heat insulation can be maintained in the vacuum layer 12.

The example of this embodiment described heat insulation vacuum layers 12, 13, 15 formed in the entire surrounding wall 9 and the partition wall 8. However, this invention is not limited to this arrangement and may for instance, form the heat insulation vacuum layer 12 in the cylindrical wall 10 of the surrounding wall 9, however, the side wall 11 of the surrounding wall 9 and the partition wall 8 may use heat insulating material for heat insulation without forming a vacuum layer.

The reinforcing rib 19 was secured to the outer circumferential surface of the cylindrical wall 10 of the surrounding wall 9 in this example. However, this invention is not limited to this arrangement and the reinforcing rib 19 may for instance be secured to the inner circumferential surface of the cylindrical wall 10 facing the heating chamber 3 or the outer circumferential surface of the cylindrical wall 10 and the inner circumferential surface facing the heating chamber 3.

Figure 8A:
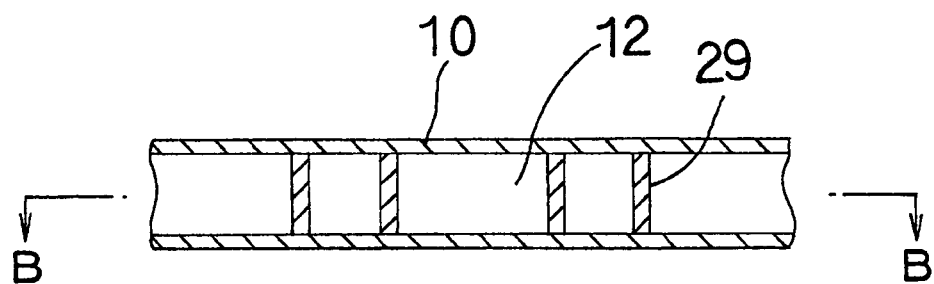
FIG. 8A is an enlarged vertical cross-sectional view showing a wall portion of the cylindrical wall.
Figure 8B:
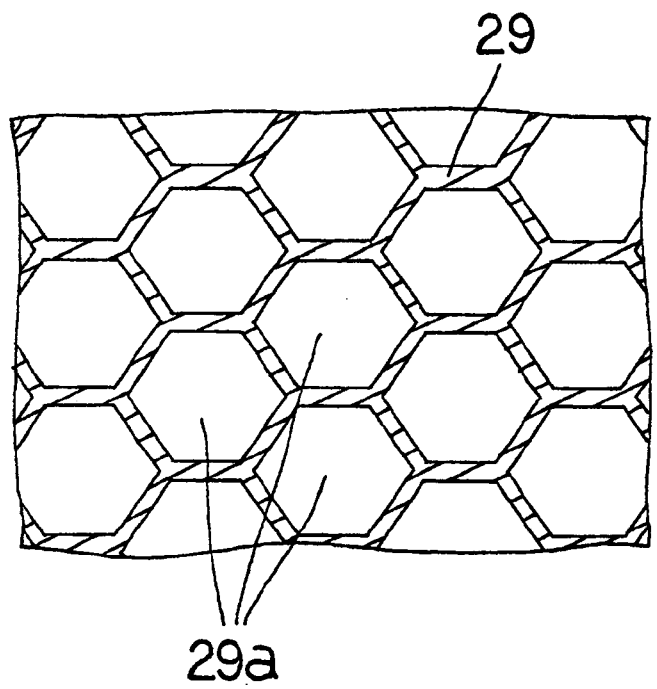
FIG. 8B is a cross-sectional view taken along the line B—B of FIG. 8A.
Figure 9:
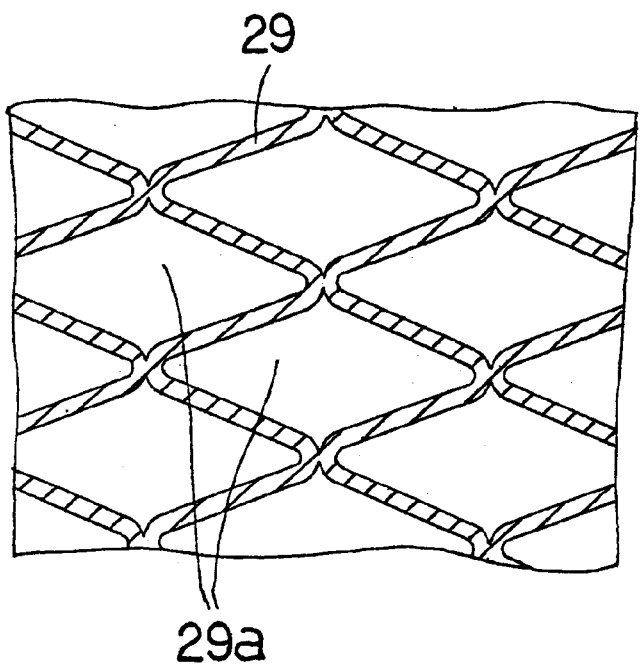
FIGS. 9 through 12 respectively show another example of a core member and correspond to FIG. 8B.
Figure 10:
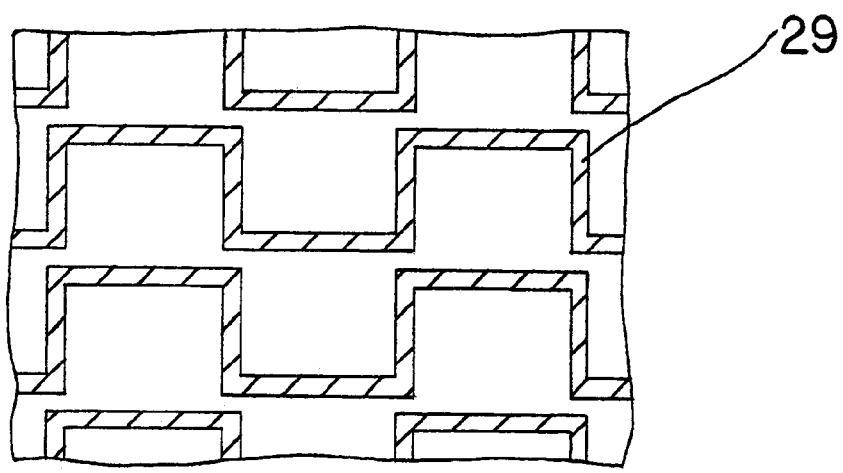
Figure 11:
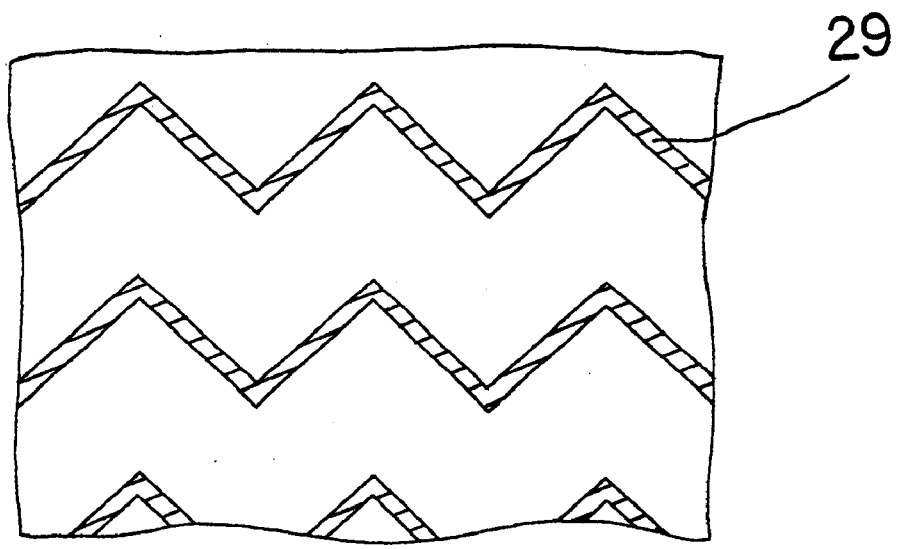
Figure 12:
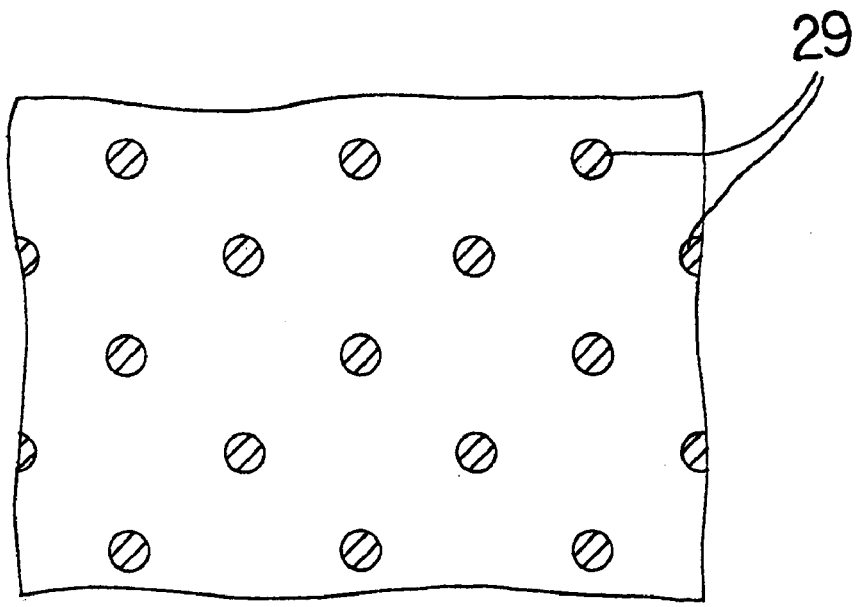
Figure 13A:
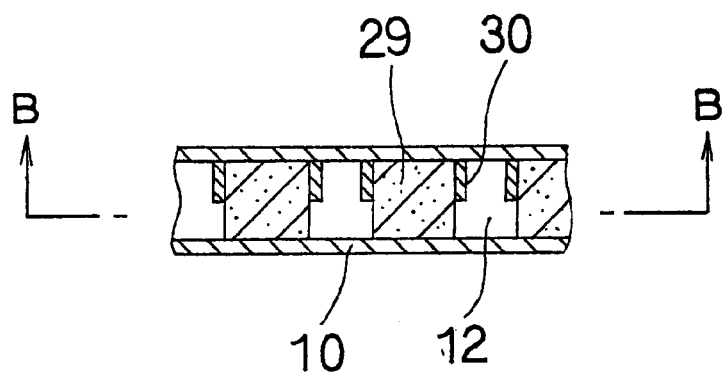
FIG. 13A is an enlarged vertical cross-sectional view showing a wall portion of the cylindrical wall.
Figure 13B:
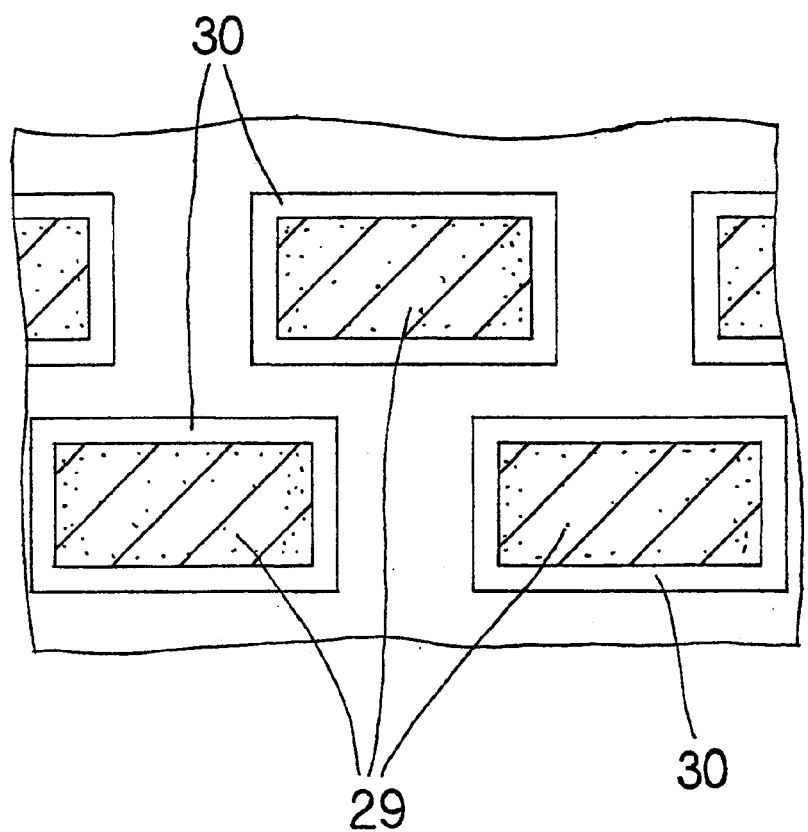
FIG. 13B is a cross-sectional view taken along the line B—B of FIG. 13A.

The member for preventing collapse of the surrounding wall 9 is not limited to the example shown in the above embodiment, and the following may also be used. The example in FIG. 8A and FIG. 8B shows a honeycomb structure core material 29 installed in the vacuum layer 12 in the cylindrical wall 10. In such a case, when separate small chambers 29a have been formed, each of these small chambers 29a is communicated with each other and formed so that all chambers can be evacuated. FIG. 9 shows the core material 29 formed in net shape, FIG. 10 in a rectangular wave shape, FIG. 11 in a sawtooth shape, and FIG. 12 in a columnar shape. FIG. 13A and FIG. 13B show the core material 29 which is contained in a frame-shaped member 30 provided on the outer surface along the radial axis within the vacuum layer 12 in the cylindrical wall 10. The core material 29 is preferably formed of heat insulating material, and gypsum board, plastic heat resistant material or styrene foam may for example be utilized as the heat insulating material.

The above embodiment also showed a heating chamber of a cylindrical shape. However, this invention is not limited to a cylindrical shape and the heating chamber may be formed from a rectangular box shape, etc.

The surrounding wall is not limited to an inner/outer dual layer of plate material and the plates may be placed at a specified distance from each other laminated in three layers or four layers, and a heat insulating vacuum layer may be formed in the gap between the plates.

In this invention as described above, heat insulation is provided by a vacuum layer formed in the surrounding wall forming the heating chamber, so that heat insulation is improved compared to the apparatus of the conventional art using heat insulating material. As a result, the electrical power consumption of the heater can be reduced and along with meeting demands for energy-saving, the running costs can also be reduced.

This invention does not utilize a heat insulating material, so that not only is the generation of industrial wastes reduced but the apparatus can be made smaller and lighter since the portions requiring heat insulation become thinner due to the vacuum layer.

This invention further can prevent warping of the surrounding wall because a reinforcing rib is used, and can prevent collapsing of the surrounding wall since a member for preventing collapse is used.

This invention can intercept radiant heat because a radiant heat intercepting member is used, so that emission of radiant heat to outside can be prevented and the heat insulating effect further improved. Also, if a reflective layer is formed to reflect radiant heat, then emission of radiant heat to outside can be even further prevented.

Industrial Applicability

As set forth in the above, the apparatus for heating a printed circuit board of this invention is effective for a drying apparatus and a reflow soldering apparatus, etc.

What is claimed is:

1. An apparatus for heating a printed circuit board comprising a conveyor to transport said printed circuit board, and a heating chamber through which said printed circuit board on said conveyor passes, wherein a surrounding wall of said heating chamber is formed with a vacuum layer for heat insulation, wherein a member for preventing collapse of said surrounding wall is inserted in said vacuum layer, wherein a member for intercepting radiant heat is provided in said vacuum layer, wherein said heating chamber comprises a preheating chamber for preheating said printed circuit board, and a reflow soldering chamber for melting solder paste and soldering electronic components on said printed circuit board, arranged in order, along the direction of transport by said conveyor.

2. An apparatus for heating a printed circuit board as claimed in claim 1, wherein a rib for reinforcing said surrounding wall is fixed to said surrounding wall.

3. An apparatus for heating a printed circuit board as claimed in claim 2, wherein said reinforcing rib has one of a T-shape, an I-shape, a channel shape, an inverted L-shape and a rectangular shape cross section.

4. An apparatus for heating a printed circuit board as claimed in claim 2, wherein said reinforcing rib is provided in the periphery of said surrounding wall at a surface perpendicular to the direction of transport by said conveyor.

5. An apparatus for heating a printed circuit board as claimed in claim 1, wherein at least a portion of said member for preventing collapse of said surrounding wall is formed of heat insulating material.

6. An apparatus for heating a printed circuit board as claimed in claim 1, wherein a radiant heat reflective layer is provided on the surface of said surrounding wall facing said heating chamber.

7. An apparatus for heating a printed circuit board as claimed in claim 1, wherein a vacuum pump is connected to said vacuum layer in said surrounding wall to allow evacuating said vacuum layer.

8. An apparatus for heating a printed circuit board as claimed in claim 1, wherein said member for preventing collapse of said surrounding wall is formed of gypsum board.

9. An apparatus for heating a printed circuit board as claimed in claim 1, wherein said member for intercepting radiant heat is a silver paper or aluminum foil.

10. An apparatus for heating a printed circuit board comprising a conveyor to transport said printed circuit board, and a heating chamber through which said printed circuit board on said conveyor passes, wherein a surrounding wall of said heating chamber is formed with a vacuum layer for heat insulation;

wherein a reinforcing rib is provided in the periphery of said surrounding wall at a surface perpendicular to the direction of transport by said conveyor.

* * * * *